United States Patent [19]

Rapp

[11] 4,387,349
[45] Jun. 7, 1983

[54] LOW POWER CMOS CRYSTAL OSCILLATOR

[75] Inventor: A. Karl Rapp, Los Gatos, Calif.

[73] Assignee: National Semiconductor Corporation, Santa Clara, Calif.

[21] Appl. No.: 216,332

[22] Filed: Dec. 15, 1980

[51] Int. Cl.³ .............................................. H03B 5/36
[52] U.S. Cl. ............................ 331/116 FE; 368/159
[58] Field of Search ................... 331/116 FE, 116 R; 368/159

[56] References Cited

U.S. PATENT DOCUMENTS 3,887,881  6/1975  Hoffmann .............. 331/116 FE X
4,095,195  6/1978  Saito ........................ 331/116 FE
4,307,354  12/1981  Miyagawa et al. ........ 331/116 FE
4,309,665  1/1982  Yamashiro ............. 331/116 FE X

FOREIGN PATENT DOCUMENTS 54-2042  9/1979  Japan ........................... 331/116 FE
55-53906  4/1980  Japan ........................... 331/116 FE Primary Examiner—Siegfried H. Grimm
Attorney, Agent, or Firm—Gail W. Woodward; Paul J. Winters; Neil B. Schulte

[57] ABSTRACT

A two transistor CMOS inverter has the two transistor gates coupled together by a coupling capacitor. D-C gate bias is supplied to each transistor through high value resistors. The P-channel transistor is biased one threshold below $V_{DD}$ and the N-channel transistor is biased one threshold above ground. The biasing voltages are developed through the use of a current mirror so that the biasing is independent of processing variables and temperature. This form of biasing renders the circuit class B regardless of the source to drain voltage and ensures low current operation. A crystal oscillator created using such an inverter and biasing will operate at voltages substantially below sum of P and N thresholds and at a current level about one-fifth of that of a conventional CMOS oscillator.

1 Claim, 4 Drawing Figures

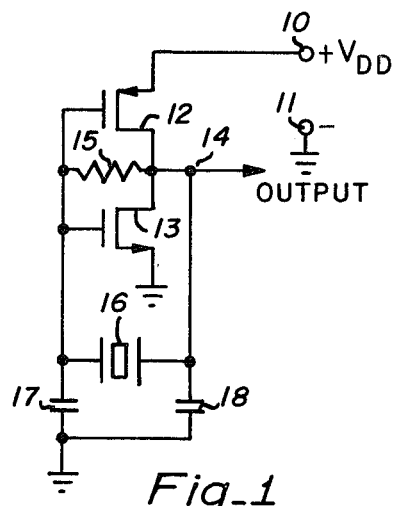
Fig_1
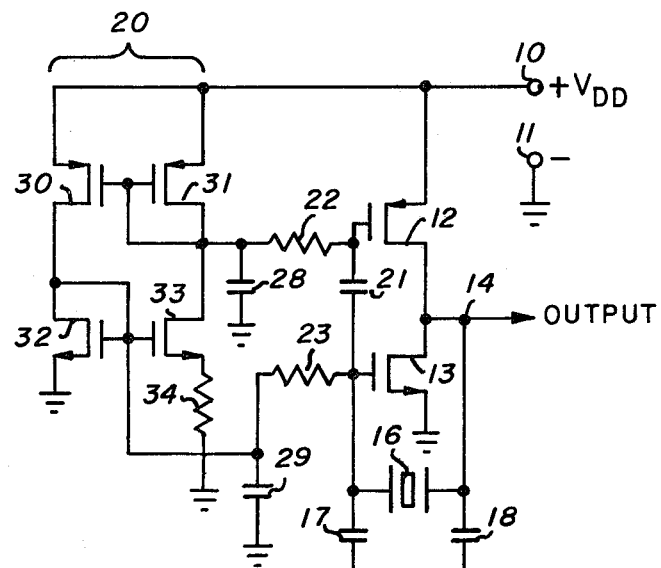
Fig_2
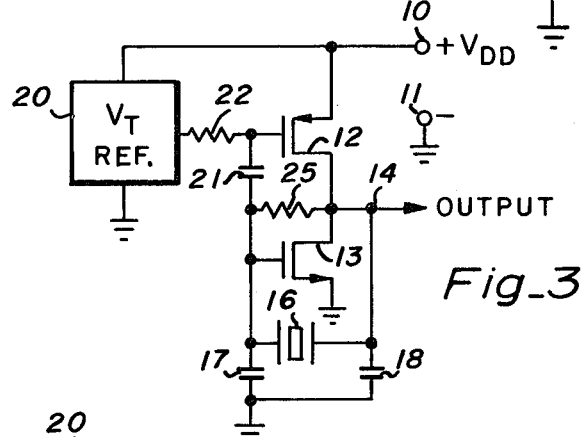
Fig_3
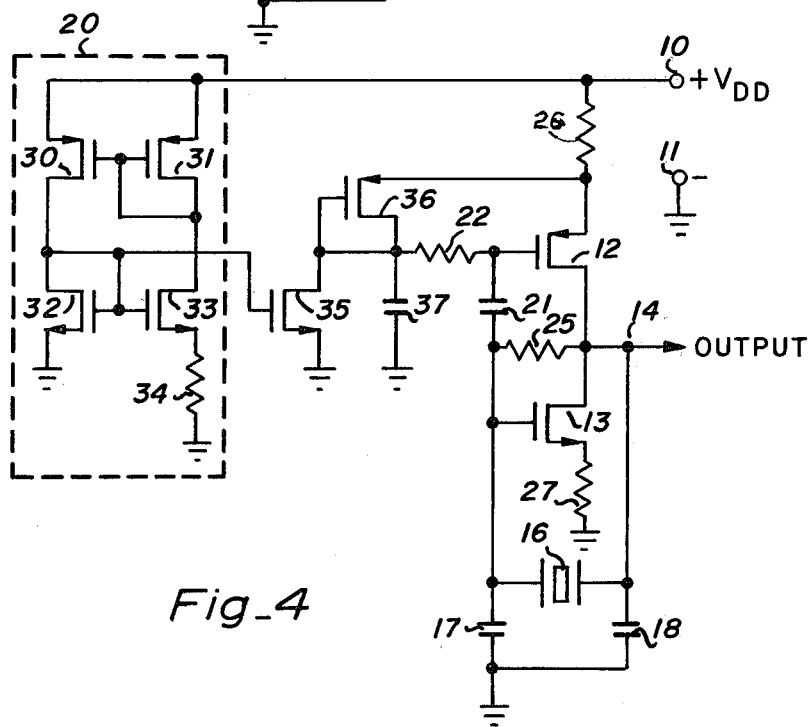
Fig_4

LOW POWER CMOS CRYSTAL OSCILLATOR

BACKGROUND OF THE INVENTION

The invention relates to complementary metal oxide semiconductor (CMOS) devices, and in particular, relates to a low power type of oscillator. Normally, an oscillator is created using a CMOS inverter by coupling a resonant circuit between the output and input terminals. Such oscillators draw very little current and operate best when the applied voltage is equal to the sum of the P-channel and N-channel device threshold voltages. Once the voltage is reduced below this value the circuit performance deteriorates rapidly. Oscillator startup will not occur for supply-voltage values below the sum of device thresholds. While the circuit operates in class B at sum of thresholds, when the supply voltage exceeds the value, switching transients become a problem and the circuit will draw appreciable current in oscillator operation. While this current is low and while CMOS circuitry has gained widespread use in battery-operated devices, it would be desirable to reduce the current drain.

U.S. Pat. No. 4,211,985 shows one approach to current drain reduction. High value resistance elements are coupled in series with the drain electrodes in a CMOS inverter. Each transistor is biased by returning its gate through a high value resistance to its drain. This forces each transistor to operate at its threshold. To operate effectively, this oscillator is coupled to a second CMOS inverter pair which is biased from the same resistors, but has its collectors commonly connected.

SUMMARY OF THE INVENTION

It is an object of the invention to create a CMOS oscillator in which the two complementary transistors are optimally biased class B from an external bias source.

It is a further object of the invention to employ a CMOS current mirror to develop a first voltage one threshold above ground and a second voltage that is one threshold below the supply voltage and to use these two voltages to bias the two elements in a CMOS inverter to produce class B operation.

It is a still further object of the invention to bias a CMOS inverter in an oscillator from an external source which provides optimum starting of oscillation and operates at reduced current drain.

These and other objects are achieved as follows. A CMOS inverter is created with a capacitor coupling the two gates together for a-c. A CMOS current mirror is used to develop a first voltage that is one N-channel threshold above ground and a second voltage that is one P-channel threshold below $V_{DD}$. A pair of large value resistors is employed to couple these bias voltages to the inverter N-channel and P-channel device gates respectively. When a tuned circuit is coupled between the inverter output and one of the gates, an oscillator is created which is automatically class B biased regardless of the $V_{DD}$ value. Such an oscillator will start up and run at voltage levels substantially lower than those required by the prior art circuits and less current is required in operation.

In one alternative embodiment only the P-channel device is biased from a current mirror while the N-channel is biased from the normally used feedback resistor. In another alternative embodiment, a pair of transient suppressing resistors is included in the inverter and an isolation buffer is coupled between the current mirror and the P-channel device biasing resistor.

BRIEF DESCRIPTION OF THE DRAWING

FIG. 1 is a schematic diagram of a prior art oscillator.

FIG. 2 is a schematic diagram of the circuit of the invention.

FIG. 3 is a schematic diagram of an alternative embodiment.

FIG. 4 is a schematic diagram of the preferred embodiment of the invention.

DESCRIPTION OF THE INVENTION

FIG. 1 shows a conventional prior art CMOS oscillator. The circuit is powered from a $V_{DD}$ supply connected between terminals 10(+) and 11(−). P-channel transistor 12 and N-channel transistor 13 have their source-drain circuits coupled in series across the power supply and their gates are coupled together to provide the circuit input. The transistor drains coupled to node 14 provide the oscillator signal output. Resistor 15 provides the d-c input bias. Quartz crystal 16, in conjunction with capacitors 17 and 18, operates in the anti-resonant mode to provide signal feedback of the proper phase to support oscillation. If desired, either or both of capacitors 17 and 18 can be made variable to trim the oscillator frequency. In order to oscillate, such a circuit requires that the invertor gain exceed the losses in the feedback loop. The inverter operates as a linear amplifier. Therefore, both of the transistors will be conductive through a substantial fraction of the oscillation cycle. When the supply voltage is at the sum of thresholds, the circuit has the greatest gain. However, if the supply exceeds this value, the circuit becomes increasingly inefficient. Most of such oscillator circuits are intended for battery operation and the supply voltage, particularly for new batteries, is selected to be well above the sum of thresholds level.

FIG. 2 illustrates the nature of the invention. A voltage reference supply 20 has been added to the oscillator and a capacitor 21 employed to couple the transistor gates together. High value resistors 22 and 23 couple reference voltages to transistor 12 and 13 respectively. Capacitors 28 and 29 act as signal bypass elements so that the oscillator signals are not coupled to mirror 20. Otherwise, the oscillator circuit functions normally.

Resistor 22 couples a reference potential one P-channel threshold below $V_{DD}$ to the gate of transistor 12. Resistor 23 couples a reference potential one N-channel threshold above ground to the gate of transistor 13. Thus transistors 12 and 13 are optimally biased class B regardless of the value of $V_{DD}$. If resistors 22 and 23 are made very high, and the gate capacitance of transistor 12 quite small, the value of capacitor 21 can be small and still serve as a coupling capacitor. Since there is no gate current, these resistors can have extremely high values.

The reference circuit 20 can be a conventional CMOS current mirror as shown designed to draw a very small operating current. Transistor 33 is designed to have higher conductance than 32. For equal currents then, less gate overdrive voltage (gate-source voltage in excess of threshold) is required by 33. The voltage drop across resistor 34 is established to cause the required decrease in overdrive. Current in 33 biases P-channel transistor 31 to establish a $V_T$ drop from its source to drain. This current is mirrored in transistor 30, which in turn biases N-channel transistor 32.

Since transistors 12 and 13 are optimally biased, the oscillator will start oscillating at $V_{DD}$ values well below the sum of thresholds. When oscillating at higher $V_{DD}$ voltages, the operating current will be controlled by the biasing circuit and can be made substantially lower than that of the prior art circuit.

It can be seen that resistors 22 and 23 will act to couple a portion of the a-c signal voltages at the gates of transistors 12 and 13 to reference supply 20. Since the current mirror in supply 20 is composed of CMOS transistors, any appreciable a-c signal will be peak rectified and can produce bias shifting. This can be avoided by connecting bypass capacitors 28 and 29 as shown across the bias supply terminals. Since resistors 22 and 23 are very large, only small bypass capacitors are needed.

FIG. 3 shows an alternative oscillator bias configuration. Resistor 22 provides bias for transistor 12. Resistor 25, which is the equivalent for resistor 15 of FIG. 1, provides the bias for transistor 13. Resistor 25 will pull the gate of transistor 13 to a bias level that just barely turns it on. This means that node 14 will operate at one N-channel threshold above ground.

FIG. 4 shows the preferred circuit of the invention. Resistor 26 has been coupled in series with the source of transistor 12 and resistor 27 has been coupled in series with the source of transistor 13. These load resistors act to reduce the transient currents in the related transistors.

Voltage reference 20 is isolated from the oscillator by means of a buffer. As described above, P-channel transistors 30 and 31 operate with N-channel transistors 32 and 33 to mirror the current flowing in resistor 34. Since resistor 34 can be made quite large and the current varies as the square of the resistor value, these currents are very small. The gate of transistor 32 will be one N-channel threshold above ground while the gate of transistor 31 will be one P-channel threshold below $V_{DD}$.

Transistors 35 and 36 form an inverting buffer operated from the current mirror. Since the source of transistor 36 is coupled to the source of transistor 12, the bias supplied to transistor 12 through resistor 22 will be equal to one P-channel threshold. Resistor 25 biases the gate of transistor 13 to one N-channel threshold above its source as described in connection with FIG. 3.

Capacitor 37 has a value selected so that in conjunction with resistor 22 it couples an attenuated signal from the gate of transistor 12 to the drain of transistor 36. This attenuated signal will be peak rectified at the drain of transistor 36. The d-c thus developed will act to reduce the current in transistor 12. The buffer circuit will act to ensure that oscillation will start using class B bias. Then, once oscillation has started, the bias point is changed to reduce current drain in the oscillator transistors.

EXAMPLE

The circuit of FIG. 4 was constructed as shown. The following device geometries were used:

| Transistor | W/L Ratio (mils) |
|---|---|
| 12 | 7/0.5 |
| 13 | 8/0.35 |
| 30 | 1/0.5 |
| 31 | 1/0.5 |
| 32 | 1/0.4 |
| 33 | 2/0.4 |
| 35 | 2/0.4 |
| 36 | 0.5/0.5 |

The following component values were used:

| Component | Value | Units |
|---|---|---|
| Capacitor 21 | 10 | picofarads |
| Resistor 22 | 125 | megohms |
| Resistor 25 | 20 | megohms |
| Resistor 26 | 0.1 | megohms |
| Resistor 27 | 0.1 | megohms |
| Resistor 34 | 0.4 | megohms |
| Capacitor 37 | 30 | picofarads |

The crystal oscillator tank circuit operated at about 32 kHz. While sum of thresholds was 1.2 volts, the circuit would oscillate at voltages down to 0.5 volt and start at 0.6 volt. The current drain with 1.5-volt supply was about 0.25 microampere which is about 5 times lower than the typical prior art circuit.

The invention has been described and a working example detailed. There are alternatives and equivalents, within the spirit and intent of the invention, that will occur to a person skilled in the art upon reading the foregoing description. Accordingly it is intended that the scope of the invention be limited only by the following claims.

I claim:
1. A CMOS oscillator circuit comprising:
   first and second terminals connectable to a source of operating power;
   first and second complementary transistors having their source drain circuits directly connected in series across said first and second terminals;
   capacitive means coupling the gates of said first and second transistors together;
   resonant circuit means coupled between the drain and gate of one of said pair of transistors to create an oscillatory feedback;
   a current mirror configured to develop a threshold biasing potential;
   high value resistor means for coupling said threshold biasing potential to the gate of at least one of said first and second transistors; and
   a buffer coupled between said current mirror and said one of said first and second transistors.

* * * * *